United States Patent [19]

Tabata et al.

[11] Patent Number: 4,811,062

[45] Date of Patent: Mar. 7, 1989

[54] METHOD FOR ALIGNING FIRST AND SECOND OBJECTS RELATIVE TO EACH OTHER AND APPARATUS FOR PRACTICING THIS METHOD

[75] Inventors: Mitsuo Tabata, Yokohama; Toru Tojo, Kanagawa; Hiroaki Shimozono, Tokyo, all of Japan

[73] Assignees: Kabushiki Kaisha Toshiba, Kawasaki; Tokyo Kogaku Kikai Kabushiki Kaisha, Tokyo, both of Japan

[21] Appl. No.: 214,821

[22] Filed: Jul. 1, 1988

Related U.S. Application Data

[63] Continuation of Ser. No. 12,282, Feb. 9, 1987, abandoned.

[30] Foreign Application Priority Data

Feb. 14, 1986 [JP] Japan ................................. 61-30516

[51] Int. Cl.$^4$ ............................................. G01B 11/26
[52] U.S. Cl. .................................. 356/152; 250/202; 356/400
[58] Field of Search .............. 29/407, 720, 703, 705, 29/714; 250/202; 356/152, 398, 400

[56] References Cited

U.S. PATENT DOCUMENTS

| | | | |
|---|---|---|---|
| 3,660,157 | 5/1972 | Villers et al. | 428/174 |
| 3,989,385 | 11/1976 | Dill et al. | 356/152 |
| 4,052,603 | 10/1977 | Karlson | 356/152 X |
| 4,090,068 | 5/1978 | Widmann et al. | 356/152 X |
| 4,103,998 | 8/1978 | Nakazawa et al. | 356/152 |
| 4,269,505 | 5/1981 | Mayer | 356/152 X |
| 4,353,087 | 10/1982 | Berry et al. | 356/152 X |
| 4,357,100 | 11/1982 | Mayer et al. | 356/152 X |
| 4,442,388 | 4/1984 | Phillips | 29/407 X |
| 4,496,241 | 1/1985 | Mayer | 356/152 |
| 4,557,599 | 12/1985 | Zimring | 356/243 |
| 4,668,089 | 5/1987 | Oshida et al. | 356/152 |

OTHER PUBLICATIONS

Microcircuit Engineering; G. Dubroeucq; 1980.
SPIE; Trutna, Jr.; 1984.
IBM Technical Disclosure Bulletin, vol. 20, No. 3, Aug. 1977, pp. 1187–1188, New York, U.S.; H. E. Hunziker: "Use of Radom Patterns and Grilles for Mask Alignment in X-Ray Lithography".

*Primary Examiner*—P. W. Echols
*Assistant Examiner*—Andrew E. Rawlins
*Attorney, Agent, or Firm*—Oblon, Fisher, Spivak, McClelland & Maier

[57] ABSTRACT

In a method for aligning first and second objects relative to each other, according to this invention, the first and second objects are arranged opposite to each other, and are aligned in a direction perpendicular to their opposing direction. A grating pattern is formed, as an alignment mark, on the first object, and a checkerboard-like grating pattern is formed, also as an alignment mark, on the second object. A light beam emitted from an alignment light source is radiated onto the checkerboard-like grating pattern of the second object. The light beam diffracted by the checkerboard-like grating pattern is guided onto the grating pattern of the first object. The light beam diffracted by the grating pattern of the first object is detected by a detector. Since the light beam emitted from the light source is diffracted by the checkerboard-like grating pattern, a relative position of the first and second objects can be detected, irrespective of the distance therebetween. The first and second objects are accurately aligned, based on the detection result. This invention can be applied to a method for aligning a mask and a wafer when a circuit pattern pre-formed on the mask is to be transferred onto the wafer.

23 Claims, 7 Drawing Sheets

METHOD FOR ALIGNING FIRST AND SECOND OBJECTS RELATIVE TO EACH OTHER AND APPARATUS FOR PRACTICING THIS METHOD

This application is a continuation of application Ser. No. 012,282, filed on Feb. 9, 1987, now abandoned.

BACKGROUND OF THE INVENTION

The present invention relates to a method for aligning first and second objects relative to each other, and, more particularly, to a method for aligning a mask and a wafer when a circuit pattern is to be transferred onto a wafer, in the process of manufacturing a semiconductor device. Furthermore, the present invention relates to an apparatus for aligning first and second objects and, more specifically, to an apparatus for aligning a mask and a wafer.

In the process of manufacturing a semiconductor device such as an LSI, an optical projection/exposure apparatus is used for transferring a circuit pattern onto a wafer. Using this apparatus, a circuit pattern pre-formed on a mask is reduced in scale and then transferred onto a wafer by a optical projection system and a mercury lamp. Before the circuit pattern is transferred, however, the mask and the wafer must be precisely aligned (mask alignment). More specifically, the mask and the wafer must be aligned in a direction perpendicular to the direction of light projection onto the circuit pattern.

As examples of mask alignment methods, the TTL (through-the-lens) method and the off-axis method are known. When using the TTL method, a light beam from a projection optical system is projected onto diffraction gratings formed on each of a mask and a wafer, in order to detect the relative position of the mask and the wafer. In contrast, when using the off-axis method, an off-axis microscope, instead of the projection optical system, is used to align the mask with the wafer. The mask and the wafer are individually aligned with the off-axis microscope, outside the projection range of the circuit pattern. Then, the mask and the wafer, which are aligned with each other, are moved to within the projection range. The time for positioning, needed for the off-axis method is shorter than that needed in the TTL method. However, the off-axis method involves many error factors, and high-precision alignment is hard to attain. For this reason, the TTL method is the most widely-used method for aligning the mask and the wafer.

One TTL mask alignment method, which involves completely overlapping two grating patterns, is disclosed in the article, G, Dubroeucq, 1980, ME, W. R. Trutna, Jr., 1984 SPI. When this method is employed, laser beams are radiated onto grating patterns respectively formed on a mask and a wafer, and diffracted beams are incident on a photodetector, so as to be converted to an electrical signal. The electrical signal is processed by a processor, and the relative position of the mask and the wafer is detected. The mask and the wafer are aligned based on the detection result.

As is described above, when using the TTL method, laser beams are radiated through a projection lens of the projection optical system. The projection lens is arranged to minimize all aberrations with respect to a predetermined exposure wavelength of a mercury lamp. For this reason, when light which has a wavelength other than the exposure wavelength is radiated through the projection lens, chromatic aberration appears. The relative position of the mask and the wafer is detected, in a state wherein the distance between the mask and the wafer corresponds to a defocused state. In this case, sufficient detection sensitivity cannot be obtained, and reproducibility is also poor. Therefore, an error may occur in the alignment of the mask and the wafer. When the difference between two wavelengths becomes large, an aberration-correction means becomes necessary, in order to correct the optical path length.

SUMMARY OF THE INVENTION

It is an object of the present invention to provide a method for precisely aligning first and second objects relative to each other.

It is another object of the present invention to provide a method for precisely detecting the relative position of a mask and a wafer, and accurately aligning them, irrespective of the distance between them, when a circuit pattern is to be transferred onto the wafer.

It is yet another object of the present invention to provide an apparatus for precisely aligning the aforementioned first and second objects in relation to each other.

It is a further object of the present invention to provide an apparatus for accurately aligning a mask and a wafer, irrespective of the distance therebetween, when a circuit pattern is to be transferred to the wafer.

Using the method for aligning first and second objects relative to each other, according to the present invention, first and second objects are arranged opposite to each other, and are aligned in a direction perpendicular to the opposing direction. A grating pattern, serving as an alignment mark, is formed on the first object, and a checkerboard-like grating pattern, also serving as an alignment mark, is formed on the second object. Light emitted from an alignment light source is radiated onto the checkerboard-like grating pattern on the second object. Then, light diffracted by the checkerboard-like grating pattern is guided onto the grating pattern of the first object. Light diffracted by the grating pattern of the first object is detected by detection means. Light emitted from the light source is diffracted by the checkerboard-like grating pattern, so that the relative position of the first and second objects is detected, irrespective of the distance therebetween. The first and second objects are accurately aligned based on the detection result.

When a circuit pattern pre-formed on the mask is transferred onto the wafer, the mask and the wafer are arranged to oppose each other, and are aligned in a direction perpendicular to the opposing direction. A grating pattern, serving as an alignment mark, is formed on the mask, and a checkerboard-like grating pattern, also serving as an alignment mark, is formed on the wafer. Light emitted from an alignment light source is radiated onto the checkerboard-like grating pattern on the wafer. Then, light diffracted by the checkerboard-like grating pattern is guided onto the grating pattern of the mask. Light diffracted by the grating pattern of the mask is detected by detection means. Since the light emitted from the light source is diffracted by the checkerboard-like grating pattern, the relative position of the mask and the wafer is detected, irrespective of the distance therebetween. The mask and the wafer are accurately aligned based on the detection result.

DETAILED DESCRIPTION OF THE PREFERRED EMBODIMENTS

Figure 1:
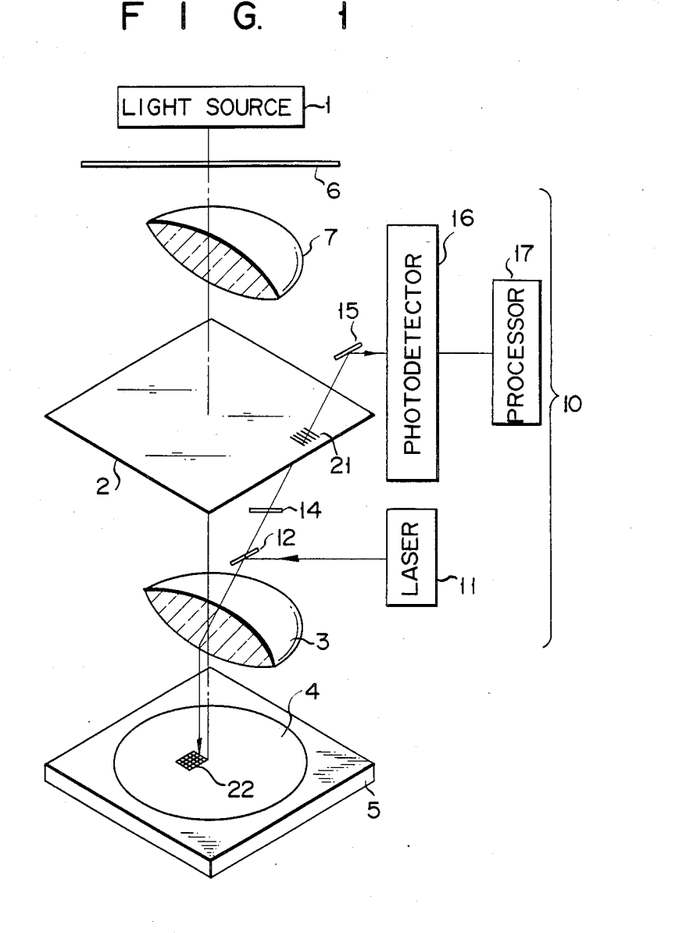
FIG. 1 is a perspective view schematically illustrating a reduction projection/exposure apparatus in an embodiment wherein an alignment method of the present invention is applied to the reduction projection/exposure apparatus.

As is shown in FIG. 1, light source 1, for emitting an exposure light beam, is arranged in a reduction projection/exposure apparatus. Light source 1, comprises, for example, a mercury lamp. Light emitted from light source 1 is shielded by shutter 6, when it is not required. Mask 2, on which a circuit pattern is preformed, is arranged in the apparatus, and wafer 4, onto which the circuit pattern is transferred, is arranged in the apparatus. Wafer 4 is supported by wafer table 5 which is movable in a predetermined direction. As a circuit pattern projection optical system, condenser lens 7 is interposed between shutter 6 and mask 2, and demagnetization projection lens 3 is interposed between mask 2 and wafer 4. More specifically, the circuit pattern formed on the mask is reduced in scale and projected by projection lens 3. When shutter 6 is opened, and light emitted from the mercury lamp is radiated, the circuit pattern is transferred onto wafer 4.

Figure 2:
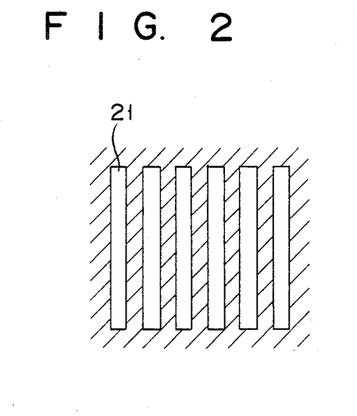
FIG. 2 is a plan view of a grating pattern formed on the mask.
Figure 3:
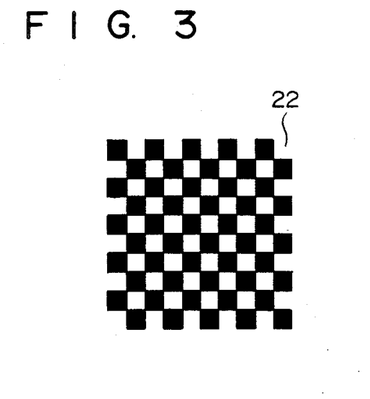
FIG. 3 is a plan view of a checkerboard-like grating pattern formed on the wafer.
Figure 4:
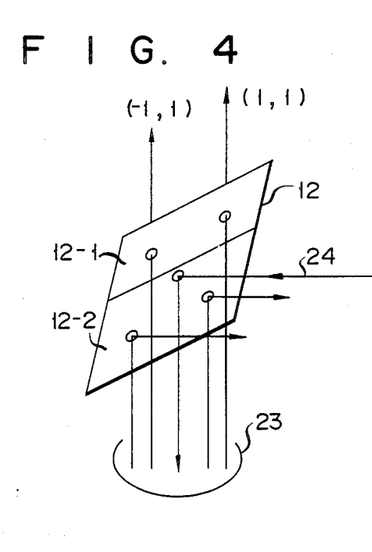
FIG. 4 is a perspective view schematically illustrating the structure of a spatial filtering mirror.

In this exposure apparatus, optical system 10 for aligning mask 2 and wafer 4, is arranged. A one-dimensional grating pattern, serving as an alignment mark, is formed on mask 2 as is shown in FIG. 2. A checkerboard-like grating pattern is formed on wafer 4, as can be seen in FIG. 3. Optical system 10 comprises laser 11 for emitting laser beams having good coherence. Optical system 10 further comprises spatial filtering mirror 12, deflector 14, and reflection mirror 15. Spatial filtering mirror 12 is constituted by transmission area 12-1 and reflection area 12-2, as is shown in FIG. 4. Filtering mirror 12 is a dichroic mirror which transmits the total amount of exposure light, when the circuit pattern is exposed. Filtering mirror 12 may be moved outside an exposure range, when the circuit pattern is exposed. In addition, photodetector 16 is arranged for receiving light diffracted by the grating pattern, and converting it into an electrical signal. Processor 17 processes the electrical signal.

A method for aligning mask 2 and wafer 4, using the projection/exposure apparatus, will now be described.

Laser beam 24 emitted from laser 11 is reflected by spatial filtering mirror 12, and is incident on grating pattern 22 of wafer 4, through projection lens 3. The diffracted beam reflected by grating pattern 22 is focused on grating pattern 21 of mask 2, via projection lens 3, spatial filtering mirror 12, and deflector 14.

Figure 5:
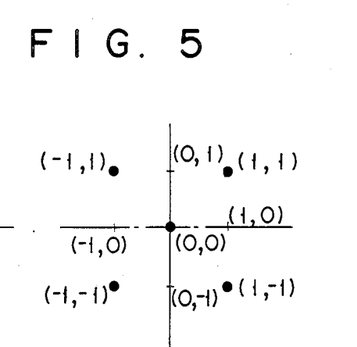
FIG. 5 is a plan view of a diffraction image formed by a beam diffracted by a grating pattern of a wafer.

Grating pattern 22 is a checkerboard-like pattern, as can be seen in FIG. 3. For this reason, diffracted beams on a Fourier transfer plane of projection lens 3 are two-dimensionally diffracted beams. FIG. 5 shows diffracted beams of the 0th and ± first orders. The numbers of orders of diffracted beams are represented by (X,Y) coordinates. The X-axis indicates the number of the order of diffracted beams in the alignment direction, and the Y-axis indicates the number of the order of diffracted beams normal to the alignment direction. The direction of alignment is the direction normal to the bars of grating pattern 21, that is, the horizontal direction in FIG. 2. The intensities of diffracted beams of the $(\pm 1,0)$th and $(0,\pm 1)$th orders are zero, and diffracted beams of the $(0,0)$th and $(\pm 1,\pm 1)$th orders have predetermined intensities. When these two-dimensionally diffracted beams 23 pass through spatial filtering mirror 12, mirror 12 shields diffracted beams of the $(-1,-1)$th, $(1,-1)$th and $(0,0)$th orders. The diffracted beams of the $(\pm 1,0)$th and $(0,\pm 1)$th orders have an intensity of zero. Therefore, the diffracted beams transmitted through spatial filtering mirror 12 are only those of the $(1,1)$th and $(-1,1)$th orders. These diffracted beams are incident on grating pattern 21 of mask 2, via deflector 14.

The diffracted beams of the $(1,1)$th and $(-1,1)$th orders are again diffracted when they pass through grating pattern 21. The double-diffracted beams are detected by photodetector 16, and are converted to an electrical signal. The electrical signal is supplied to processor 17, to be processed, whereby the relative positions of mask 2 and wafer 4 are detected.

In this manner, the double-diffracted beams which pass through grating pattern 21 provide positional information of grating patterns 21 and 22, i.e., relative position information. Thus, when the intensity of the double-diffracted beams is detected, this positional information can be obtained.

Figure 6:
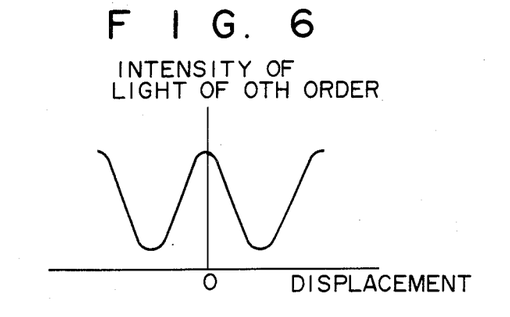
FIG. 6 is a graph showing the relationship between the intensity of double diffraction light and the displacement of a mask and a wafer with respect to their setting positions.

For example, FIG. 6 shows the relationship between the intensity of the double-diffracted beams of the 0th order in the direction of alignment and displacements of the mask and the wafer with respect to their setting positions. More specifically, when position correction is performed to maximize the intensity of the diffracted beams of the 0th order, wafer table 5 is moved, so that mask 2 and wafer 4 are aligned.

When employing a alignment method using an two-dimensional diffraction grating disclosed in the article G. Dubroeacq, the intensity of the double-diffracted beams of the 0th order in the direction of alignment, passing through a mask, can be given by the following formula $I_D$, based on theoretical analysis:

$$I_D = I_0 \times [(\tfrac{1}{2})^4 + (1/\pi)^2 \cdot \cos(\pi\lambda Z/P^2) \cdot \cos(2\pi X/P) + 4(1/\pi)^4 \cdot \cos^2(2\pi X/P)]$$

where Io is the amount of light determined by the diffraction efficiency, P is the pitch of a diffraction grating, $\lambda$ is the wavelength of an alignment light beam, X is the relative position of mask 2 and wafer 4, and Z is the amount of defocus. As can be seen from the above formula, $I_D$ varies greatly in accordance with a change in distance, in the Z direction, between the wafer and the mask.

Using the alignment method of the present invention where a checkerboard-like diffraction grating is employed, the intensity of the double-diffracted beams of the 0th order in the direction of alignment can be given by the following formula Ic:

$$I_c = I_0 \times (2/\pi^2)^2 \times 2[1 + \cos(2\pi 2X/P)]$$

Figure 7:
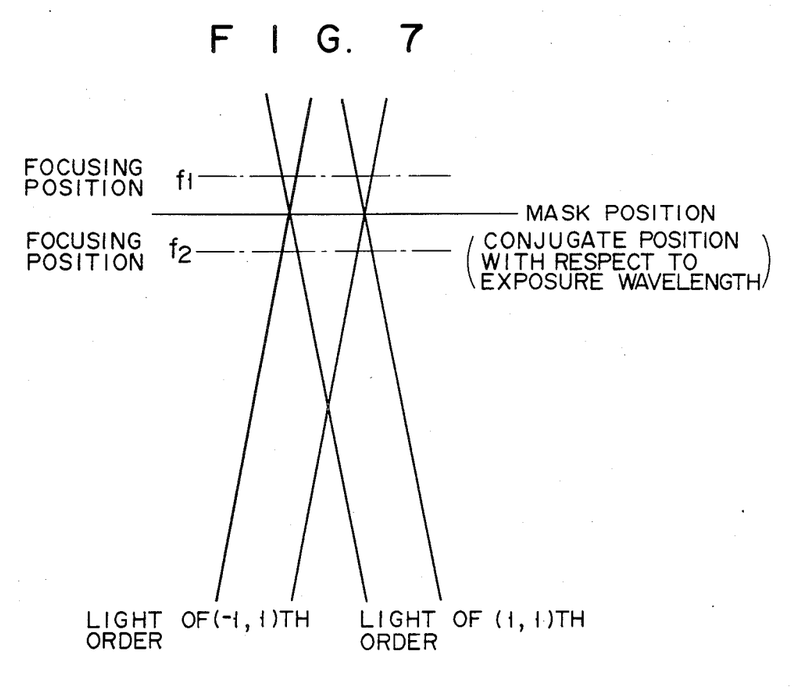
FIG. 7 is an illustration showing the focusing state of a diffracted beam incident on a mask surface.

In this manner, since the above formula does not include the Z term, Ic does not vary in accordance with a change in distance, between the wafer and the mask, in the Z direction, i.e., a change in the amount of defocus Z. More specifically, two diffracted beams of (−1,1)th and (1,1)th orders from wafer 4 are focused on mask 2, as is shown in FIG. 7. Even if the focusing positions correspond to fl or f2 in FIG. 7, due to chromatic aberration of projection lens 3, an alignment-detection signal will not be changed. Therefore, the relative positions of the mask and the wafer can be detected, irrespective of any chromatic aberration which occurs when an alignment beam is radiated through projection lens 3. For this reason, detection errors can be prevented from occurring.

As can be seen from the above formula, according to the method of this embodiment, a change in diffracted beam intensity Ic, with respect to detection position X, is represented by a cyclic function of (2X/P), i.e., two cycles appear per pitch. In the conventional method, a change in diffracted beam intensity Ip, with respect to detection position X, is represented by a cyclic function of (X/P), i.e., one cycle appears per pitch. For this reason, in this embodiment, a detection sensitivity twice that of the conventional method can be obtained, using the same size of grating patterns. The grating pattern has a limited pattern size with regard to miniaturization. For this reason, any improvement in detection sensitivity can be very advantageous with respect to high-precision alignment of the mask and the wafer.

As regards the method of this embodiment, the wavelength of the alignment light and the exposure wavelength may be different from each other. A resist film on wafer 4 can be protected from being exposed during alignment. Thus, almost no alignment light is absorbed in the resist film. Since the grating pattern is not exposed, it can be easily protected.

Figure 8:
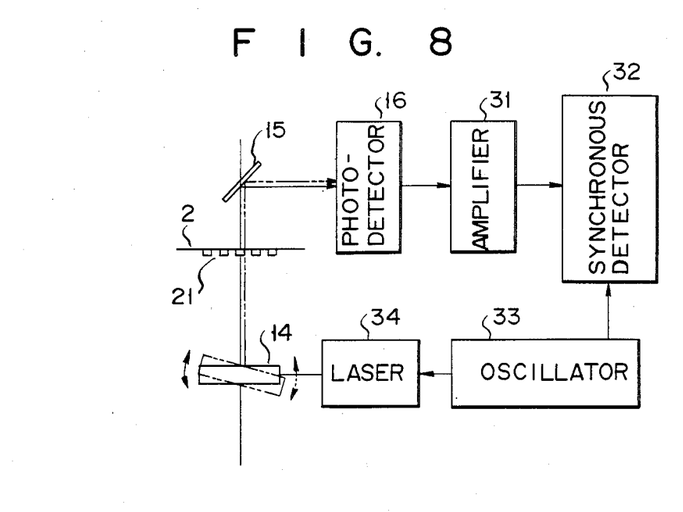
FIG. 8 is a block diagram of an apparatus for performing signal-sync detection processing, using vibrational plane-parallel.
Figure 9:
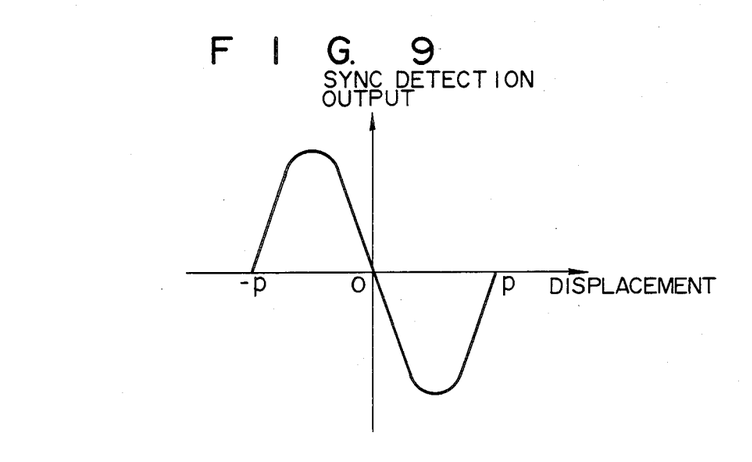
FIG. 9 is a signal waveform chart showing the relationship between a sync-detection output and the displacement of a mask and a wafer.

As has been described above, FIG. 6 shows the relationship between the intensity of the double-diffracted beams of the 0th order in the direction of alignment and displacements of the mask and the wafer, with respect to their setting positions. More specifically, when position correction is performed to maximize the intensity of the double-diffracted beams of the 0th order in the direction of alignment, mask 2 and wafer 4 are aligned. In this case, this correction means must detect the peak of a cycle function shown in FIG. 6. However, it is, in general, difficult to detect the peak of the cycle function. Thus, as a method for processing a detection signal, a detection method wherein alignment light beams are vibrated at a constant frequency to modulate a signal and the frequency is sync-detected is proposed (this sync detection method is described in detail in U.S. Pat. No. 4,642,468 to the present inventors). In this embodiment, as a vibration mechanism, deflector 14 is vibrated, as is shown in FIG. 8. Deflector 14 is arranged between mask 2 and wafer 4. An alignment beam reflected by wafer 4 is changed in synchronism with vibration of deflector 14. A signal obtained by photodetector 16 is a modulation signal synchronous with this vibration. An output signal from photodetector 16 is sync-detected by sync detector 32, with reference to a reference signal from oscillator 33 which serves as an oscillation source for vibration plane-parallel 14. An output, following sync-detection processing, is obtained as an S-shaped curve with respect to a positional displacement. Since the detection output is represented by a line crossing zero displacement, the mask and the wafer are aligned with very high precision.

Figure 10:
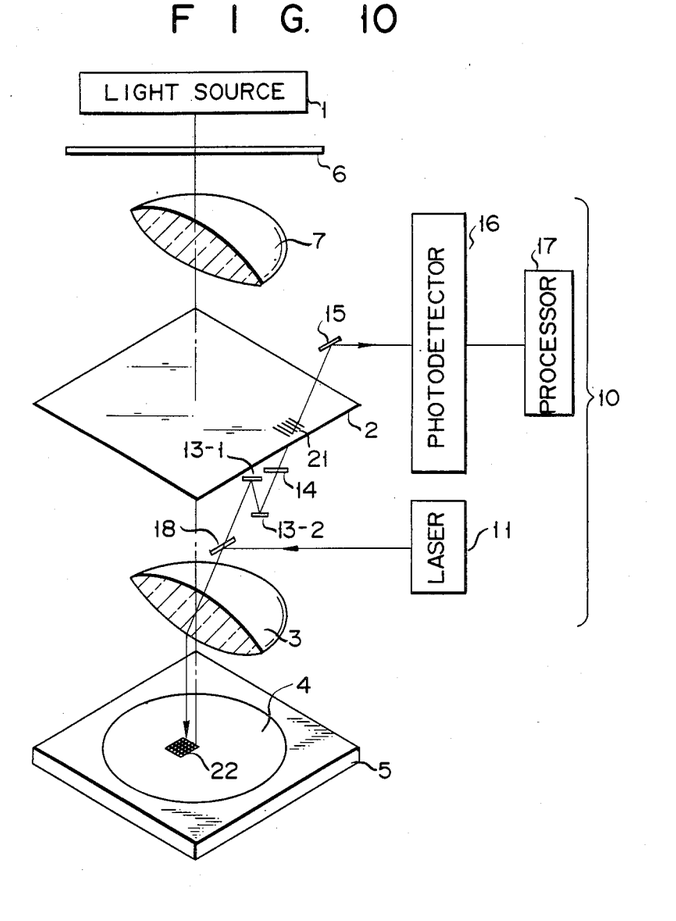
FIG. 10 is a perspective view schematically illustrating a reduction projection/exposure apparatus in a second embodiment wherein an alignment method of the present invention is applied to the reduction projection/exposure apparatus.
Figure 11:
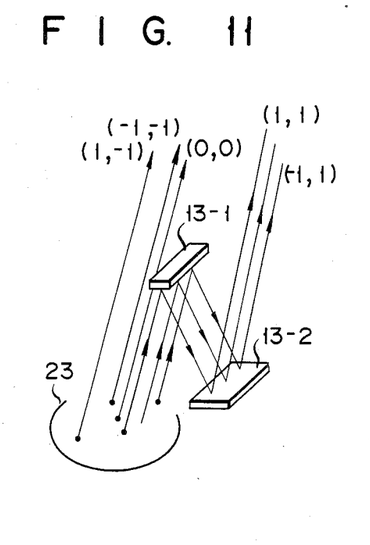
FIG. 11 is a perspective view which schematically illustrates the relationship between light reflected by a grating pattern of a wafer, and a reflection mirror.

A second embodiment of the present invention will now be described, with reference to FIG. 10. Differences between this embodiment and the previous embodiment are that spatial filtering mirror 12 is replaced by half mirror 18, and reflection mirrors 13-1 and 13-2 are arranged midway along the optical path of optical system 10. As is shown enlarged in FIG. 11, only beams of the (1,1)th and (−1,1)th orders of diffracted beams 23, reflected by grating pattern 22, are reflected by mirrors 13-1 and 13-2. Other arrangements are the same as in the previous embodiment. Grating patterns 21 and 22, respectively formed on mask 2 and wafer 4, have the same patterns as shown in FIGS. 2 and 3.

With this arrangement, substantially the same alignment as in the above embodiment can be performed. More specifically, half mirror 18 allows all the diffracted beams, which are reflected by wafer 4 and which are incident on projection lens 3, to pass therethrough. Thereafter, some of diffracted beams, for example, beams of the (1,1)th and (−1,1)th orders, are reflected by mirrors 13-1 and 13-2. For this reason, an image is focused on mask 2 by the interference of two beams, in the same manner as in the above embodiment. For this reason, alignment of the mask and the wafer can be performed irrespective of the defocus state. Therefore, with this embodiment, the same effect as in the above embodiment can be obtained, and the mask and the wafer can be aligned with high precision.

The present invention is not limited to the methods of the above embodiments. For example, in the first embodiment, a simple half mirror can be used instead of the spatial filtering mirror. In this case, all the diffracted beams, which are reflected by wafer 4 and which are incident on projection lens 3, are incident on the grating pattern on mask 2. Thus, the interference of two beams will not occur. The defocus state of mask 2 and wafer 4 thus influences the detection sensitivity. However, two cycles of change appear per pitch in detection position X of the diffracted beam intensity, as in the above embodiments. Therefore, the alignment precision can be improved to twice that in the conventional method.

Figure 12A:
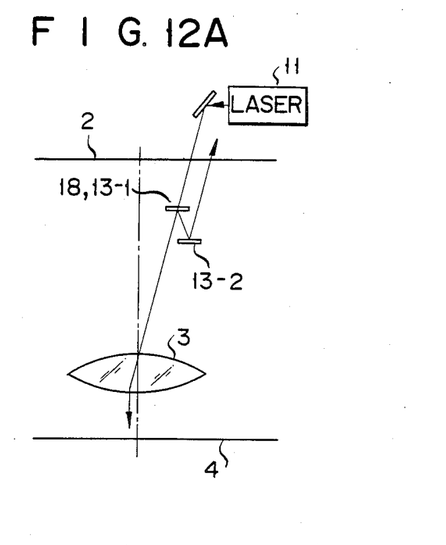
FIGS. 12A to 12C are front views schematically illustrating a reduction projection/exposure apparatus according to a modification of the first embodiment of the present invention.
Figure 12B:
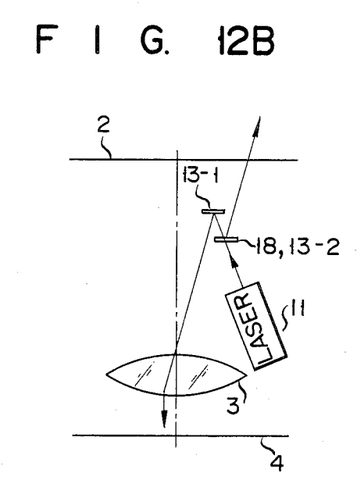
Figure 12C:
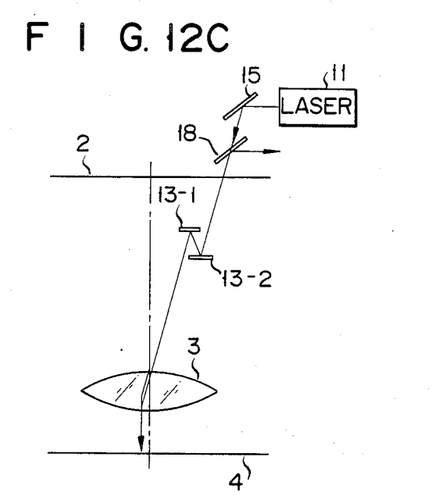
Figure 13:
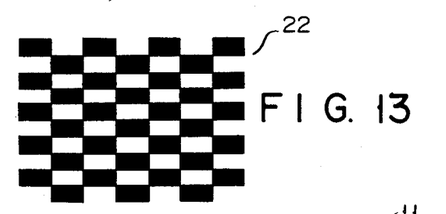
FIG. 13 is a view showing a modification of a grating pattern.

As is shown in FIG. 12, the following various methods can be adopted to a means for illuminating the grating pattern of a wafer.

In FIG. 12A, an alignment beam which is transmitted, through mask 2, and then through half mirror 18, illuminates the grating pattern of the wafer via projection lens 3. In FIG. 12B, an alignment beam is incident, from the bottom of half mirror 18, and illuminates the grating pattern of the wafer via mirror 13-2 and projection lens 3. In FIG. 12C, an alignment beam is incident from the top of half mirror 18, and illuminates the grating pattern on the wafer, along an optical path directly opposite to that in a detection mode. Although these methods provide illumination in different ways, their output characteristics of detection signals are essentially the same. In addition, various other illumination methods can be employed.

In the above embodiment, a means for vibrating a plane-parallel to vibrate the position of a beam, is adopted as a signal modulation means. Alternatively, a means for vibrating a vibration mirror can be adopted. A means for vibrating a mask or wafer, in a horizontal direction, can be used for vibrating the position of a beam. A means for alternately illuminating two sets of grating patterns having different phases, can also be adopted as a signal modulation means.

In the above embodiments, a grating pattern formed on a mask is a one-dimensional diffraction grating. The grating pattern of the mask may be a checkerboard-like pattern, as is shown in FIG. 3, or it may be a two-dimensional diffraction grating.

In the above embodiments, a grating pattern on a wafer is in the form of a combination of squares, as is also shown in FIG. 3. However, the grating pattern of a wafer can be a checkerboard-like pattern in the form of a combination of rectangles.

Figure 14A:
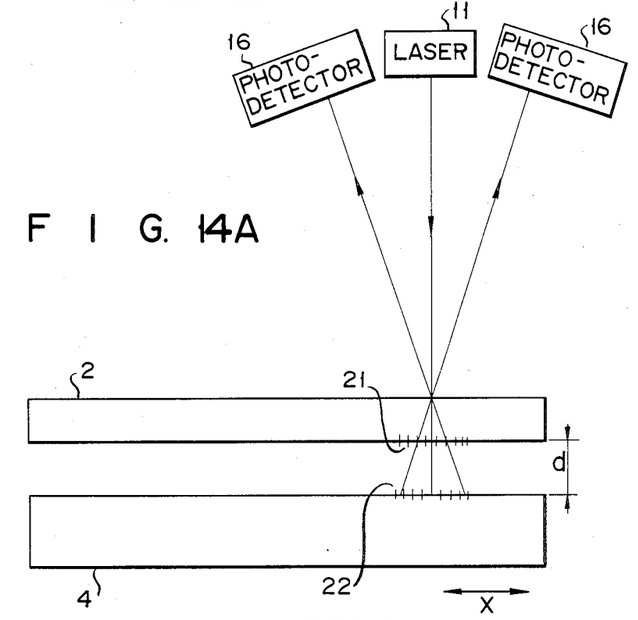
FIG. 14A is a sectional view showing a third embodiment, wherein an alignment method of the present invention is applied to an X-ray exposure apparatus.
Figure 14B:
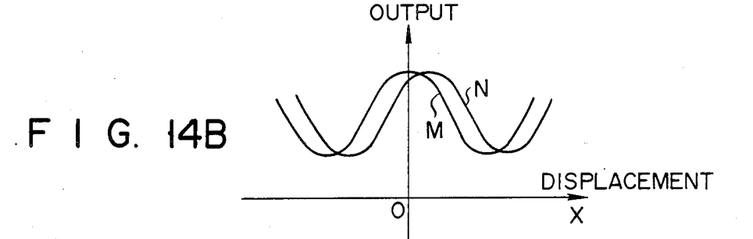
FIG. 14B is a graph of output characteristics, showing the detection result of an alignment between the mask and the wafer, in the third embodiment.

The present invention can be applied not only to the process of alignment between a mask and a wafer, but can also be applied to the process of aligning between two objects. In this latter case, an optical system need not be interposed between the two objects. For example, as is shown in FIG. 14A, in an X-ray exposure apparatus, one-dimensional grating pattern 21 is formed on first object 2, and checkerboard-like grating pattern 22 is formed on second object 4. Light emitted from laser 11 is radiated onto grating pattern 21, and the light diffracted thereby is incident on checkerboard-like grating pattern 22. Light that is reflected and diffracted by pattern 22 is incident on photodetector 16, through grating pattern 21. The light detected by photodetector 16 is converted to an electrical signal, and the signal is processed by a processor. This detection result is indicated by M of FIG. 14B. In FIG. 14B, a detection result, indicating that a two-dimensional grating pattern has been formed on a second object, as in a conventional detection method, is indicated by N. In this manner, the conventional detection method is influenced by distance d between mask 2 and wafer 4. Therefore, a detection error is present. In contrast to this, in this embodiment, irrespective of distance d, a detection error will not occur, and the relative positions of a mask and a wafer can be detected with high precision, thereby enabling them to be very precisely aligned.

What is claimed is:

1. A method for aligning first and second objects relative to each other, which objects are arranged opposite to each other, in an alignment direction perpendicular to their opposing direction, comprising the steps of:
    forming a grating pattern, as in an alignment mark, on said first object, said grating pattern having bars extending in parallel to one another and being normal to the alignment direction;
    forming a checkerboard-like grating pattern, as an alignment mark, on said second object;
    directing a light beam, emitted from a light source, onto said checkerboard-like grating pattern of said second object, so that the light beam is diffracted by said checkerboard-like grating pattern, and a diffracted beam of the ($\pm 1$)st order in the alignment direction is allowed to emerge;
    transferring said diffracted beam of the ($\pm 1$)st order on said grating pattern of said first object, so next diffracted by said first object grating pattern, and a diffracted beam of a 0th order in the alignment direction is allowed to emerge;
    detecting the diffracted beam of the 0th order; and
    adjusting a relative position between said first and second objects, in accordance with an intensity of the detected diffracted beam of the 0th order.

2. A method for aligning a mask and a wafer relative to each other, which are arranged opposite to each other, in an alignment direction perpendicular to their opposing direction, when transferring a circuit pattern formed on said mask onto said wafer, comprising the steps of:
    forming a grating pattern as an alignment mark on said mask, said grating pattern having bars extending in parallel to one another and being normal to the alignment direction;
    forming a checkerboard-like grating pattern, as an alignment mark, on said wafer;
    directing a light beam, emitted from a light source, onto said checkerboard-like grating pattern of said wafer;
    transferring the diffracted light beam, diffracted at said checkerboard-like grating pattern, onto said grating pattern of said mask;
    detecting the diffracted light beam resulting from transmission through said grating pattern of the mask; and
    adjusting a relative position between said mask and said wafer, in accordance with an intensity of the detected diffracted beam,
    wherein, in the step of transferring the diffracted beam, the beam diffracted by the checkerboard-like grating pattern is selected by a spatial filtering means to be guided to said grating pattern of said mask.

3. A method according to claim 2, including an optical system which allows the diffracted beam to pass therethrough arranged between said mask and said wafer.

4. A method according to claim 3, wherein said optical system, arranged between said mask and said wafer for allowing the diffracted beam to pass therethrough, is an optical projection system used for transferring the circuit pattern.

5. A method according to claim 4, wherein a wavelength of a beam for aligning said mask and said wafer is different from a wavelength in said projection optical system used for transferring the circuit pattern.

6. A method according to claim 2, wherein said light source used in the step of directing a light beam is a laser.

7. A method according to claim 2, wherein said grating pattern formed on said mask is of a light-transmission type, and said checkerboard-like grating pattern formed on said wafer is of a reflection type.

8. A method according to claim 2, wherein in the step of detecting the diffracted beam, an intensity of a double-diffracted beam of the 0th order diffracted by this grating pattern is detected.

9. A method according to claim 2, wherein said checkerboard-like grating pattern is formed by combining a plurality of squares.

10. A method according to claim 2, wherein said checkerboard-like grating pattern is formed by combining a plurality of rectangles.

11. A method for aligning first and second objects relative to each other, which objects are arranged opposite to each other, in an alignment direction perpendicular to their opposing direction, comprising the steps of:
forming a grating pattern, as an alignment mark, on said first object, said grating pattern having bars extending in parallel to one another and being normal to the alignment direction;
forming a checkerboard-like grating pattern, as an alignment mark, on said second object;
directing a light beam, emitted from a light source, onto said grating pattern of said first object;
transferring the light beam transmitted through said grating pattern of said first object to said checkerboard-like grating pattern of said second object, so that the light beam is reflected and diffracted by said checkerboard-like grating pattern, and a diffracted beam of a ($\pm 1$)st order in the alignment direction is allowed to emerge;
transferring the diffracted light of the ($\pm 1$)st order to said grating pattern of said first object, so that said diffracted beam of the ($\pm 1$)st order passes through said grating pattern and is diffracted by said grating pattern, and a diffracted beam of a 0th order in the alignment direction is allowed to emerge;
detecting the diffracted beam of the 0th order; and
adjusting a relative position between said first and second objects in accordance with an intensity of the detected diffracted beam of the 0th order.

12. A method according to claim 11, wherein said first object is a mask and said second object is a wafer.

13. A method for aligning a mask and a wafer relative to each other, which are arranged opposite to each other, in an alignment direction perpendicular to their opposing direction, when transferring a circuit pattern formed on said mask onto said wafer, comprising the steps of:
forming a grating pattern as an alignment mark on said mask, said grating pattern having bars extending in parallel to one another and being normal to the alignment direction;
forming a checkerboard-like grating pattern, as an alignment mark, on said wafer;
directing a light beam, emitted from a light source, onto said checkerboard-like grating pattern of said wafer;
transferring the diffracted light beam, diffracted at said checkerboard-like grating pattern, onto said grating pattern of said mask;
detecting the diffracted light beam resulting from transmission through said grating pattern of the mask; and
adjusting a relative position between said mask and said wafer, in accordance with an intensity of the detected diffracted beam,
wherein the diffracted beam diffracted by said checkerboard-like grating pattern includes a diffracted beam of a ($\pm 1$)st order in the alignment direction, and the diffracted beam diffracted by said grating pattern on said mask includes a diffracted beam of a 0th order, and the diffracted beam of the 0th order is detected by said detection means and used to align said mask and said wafer.

14. An apparatus for aligning a mask of a wafer relative to each other, which are arranged opposite to each other, in an alignment direction perpendicular to their opposing direction, when transferring a circuit pattern formed on said mask onto said wafer, comprising:
a grating pattern formed, as an alignment mark, on said mask, said grating pattern having bars extending in parallel to one another and being normal to the alignment direction;
a checkerboard-like grating pattern formed, as an alignment mark, on said wafer;
a light source for emitting a beam directed to said checkerboard-like grating pattern of said wafer, so that the light beam is diffracted by said checkerboard-like grating pattern;
means for selecting the beam diffracted by said checkerboard-like grating pattern of said wafer, and for guiding the diffracted beam to said grating pattern of said mask, so that the diffracted beam is diffracted by said grating pattern of said mask;
detection means for detecting the beam diffracted by said grating pattern of said mask; and
adjusting means for adjusting a relative position of said mask and said wafer, in accordance with an intensity of the detected beam.

15. An apparatus according to claim 14, including an optical system for allowing the diffracted beam to pass therethrough arranged between said mask and said wafer.

16. An apparatus according to claim 15, wherein said optical system, arranged between said mask and said wafer, for allowing the diffracted beam to pass therethrough, is an optical projection system used for transferring the circuit pattern.

17. An apparatus according to claim 14, wherein said means for selecting the beam diffracted by said checkerboard-like grating pattern of said wafer comprises a spatial filtering mirror.

18. An apparatus according to claim 14, wherein said means for selecting the beam diffracted by said checkerboard-like grating pattern of said wafer comprises a half mirror and a reflection mirror.

19. An apparatus according to claim 14, wherein said light source is a laser.

20. An apparatus according to claim 14, wherein said grating pattern formed on said mask is of a light-transmission type, and said checkerboard-like grating pattern formed on said wafer is of a reflection type.

21. An apparatus according to claim 14, wherein said checkerboard-like grating pattern is formed by combining a plurality of squares.

22. An apparatus according to claim 14, wherein said checkerboard-like grating pattern is formed by combining a plurality of rectangles.

23. An apparatus according to claim 14, wherein the diffracted beam diffracted by said checkerboard-like grating pattern includes a diffracted beam of a ($\pm 1$)st order in the alignment direction, and the diffracted beam diffracted by said grating pattern includes a diffracted beam of a 0th order, and the diffracted beam of the 0th order is detected by said detecting means.

* * * * *